(12) United States Patent
Toyonaga (10) Patent No.: US 11,189,638 B2
(45) Date of Patent: Nov. 30, 2021

(54) SEMICONDUCTOR MEMORY DEVICE INCLUDING THREE-DIMENSIONALLY STACKED MEMORY CELLS

(71) Applicant: Kioxia Corporation, Minato-ku (JP)

(72) Inventor: Kazunari Toyonaga, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/892,398

(22) Filed: Jun. 4, 2020

(65) Prior Publication Data
US 2021/0082951 A1    Mar. 18, 2021

(30) Foreign Application Priority Data

Sep. 18, 2019  (JP) .............................. JP2019-169907

(51) Int. Cl.
| | | |
|---|---|---|
| *G11C 16/04* | (2006.01) | |
| *H01L 27/11582* | (2017.01) | |
| *H01L 23/528* | (2006.01) | |
| *H01L 29/36* | (2006.01) | |
| *G11C 16/26* | (2006.01) | |
| *H01L 27/11573* | (2017.01) | |

(52) U.S. Cl.
CPC .... *H01L 27/11582* (2013.01); *G11C 16/0483* (2013.01); *G11C 16/26* (2013.01); *H01L 23/528* (2013.01); *H01L 27/11573* (2013.01); *H01L 29/36* (2013.01)

(58) Field of Classification Search
CPC . H01L 27/11582; H01L 23/528; H01L 29/36; H01L 27/11573; H01L 21/76877; H01L 21/28525; H01L 23/485; H01L 27/1157; G11C 16/0483; G11C 16/26; G11C 16/10

USPC ...................................................... 365/185.18
See application file for complete search history.

(56) References Cited

U.S. PATENT DOCUMENTS

| | | | | |
|---|---|---|---|---|
| 6,661,042 B2 * | 12/2003 | Hsu ...................... | H01L 27/108 | |
| | | | | 257/239 |
| 8,116,130 B1 * | 2/2012 | Ratnakumar ....... | H01L 23/5256 | |
| | | | | 365/177 |
| 9,305,867 B1 | 4/2016 | Or-Bach et al. | | |

(Continued)

FOREIGN PATENT DOCUMENTS

JP         2015-56452 A        3/2015

*Primary Examiner* — Tha-O H Bui
(74) *Attorney, Agent, or Firm* — Oblon, McClelland, Maier & Neustadt, L.L.P.

(57) ABSTRACT

A semiconductor memory device includes: a first transistor including a substrate including first and second regions of first conductive type, a first insulating film provided on the first and second regions, a first wiring of first conductive type provided on the first region, being electrically connected to the first region, and including a higher impurity concentration of first conductive type than an impurity concentration of the first region, and a second wiring of first conductive type provided on the second region, being electrically connected to the second region, and including a higher impurity concentration of first conductive type than an impurity concentration of the second region; a conductive layer provided parallel to a substrate plane above the first transistor; a pillar penetrating the conductive layer, the pillar including a semiconductor film; and a charge storage film provided between the semiconductor film and the conductive layer.

10 Claims, 8 Drawing Sheets

(56) References Cited

U.S. PATENT DOCUMENTS

| | | | |
|---|---|---|---|
| 2005/0121710 A1* | 6/2005 | Shino | H01L 21/84 |
| | | | 257/296 |
| 2015/0069499 A1 | 3/2015 | Nakaki | |
| 2018/0138192 A1 | 5/2018 | Shin et al. | |
| 2018/0151589 A1 | 5/2018 | Shimizu et al. | |

* cited by examiner

SEMICONDUCTOR MEMORY DEVICE INCLUDING THREE-DIMENSIONALLY STACKED MEMORY CELLS

CROSS-REFERENCE TO RELATED APPLICATION

This application is based upon and claims the benefit of priority from Japanese Patent Application No. 2019-169907, filed on Sep. 18, 2019, the entire contents of which are incorporated herein by reference.

FIELD

Embodiments described herein relate generally to a semiconductor memory device.

BACKGROUND

Large-capacity nonvolatile memories have been actively developed. This type of memory enables low-voltage/low-current operation, high-speed switching, and miniaturization/high integration of memory cells.

In a large-capacity memory array, many metal wirings called bit lines and word lines are arranged. Writing to one memory cell is performed by applying a voltage to a bit line and a word line connected to the memory cell. There has been proposed a memory device in which memory cells are three-dimensionally arranged using a stacked body where insulating layers and conductive layers to be word lines are alternately stacked.

DETAILED DESCRIPTION

A semiconductor memory device according to an embodiment includes: a first transistor, the first transistor including a substrate including a first region of first conductive type and a second region of first conductive type, a first insulating film provided on the first region and the second region, a first wiring of first conductive type provided on the first region, the first wiring being electrically connected to the first region, and the first wiring including a higher impurity concentration of first conductive type than an impurity concentration of the first region, and a second wiring of first conductive type provided on the second region, the second wiring being electrically connected to the second region, and the second wiring including a higher impurity concentration of first conductive type than an impurity concentration of the second region; a conductive layer provided parallel to a substrate plane above the first transistor; a pillar penetrating the conductive layer, the pillar including a semiconductor film; and a charge storage film provided between the semiconductor film and the conductive layer.

Hereinafter, embodiments will be described using the drawings. In the drawings, the same or similar parts are denoted by the same or similar reference numerals.

In the present specification, in order to indicate a positional relation of components and the like, an upward direction of the drawings is described as "above" and a downward direction of the drawings is described as "under". In the present specification, the concepts of "above" and "under" are not necessarily terms indicating relations with a direction of gravity.

Hereinafter, a case where a first-conductivity type is a p type and a second-conductivity type is an n type will be described as an example. Note that a semiconductor memory device according to an embodiment described in the present specification can be preferably implemented even if the first-conductivity type is the n type and the second-conductivity type is the p type. In the following description, notations $n^{++}$, $n^+$, and $n^-$ and $p^{++}$, $p$, and $p^-$ indicate relative levels of impurity concentrations in respective conductivity types. That is, $n^{++}$ has a relatively higher n-type impurity concentration than has a relatively higher n-type impurity concentration than n, and $n^-$ has a relatively lower n-type impurity concentration than n. Further, $p^{++}$ has a relatively higher p-type impurity concentration than $p^+$, $p^+$ has a relatively higher p-type impurity concentration than p, and $p^-$ has a relatively lower p-type impurity concentration than p. Note that the $n^{++}$ type, the $n^+$ type, and the $n^-$ type may be simply referred to as the n type, and the $p^{++}$ type, the $p^+$ type, and the $p^-$ type may be simply referred to as the p type.

Embodiment

Figure 1:
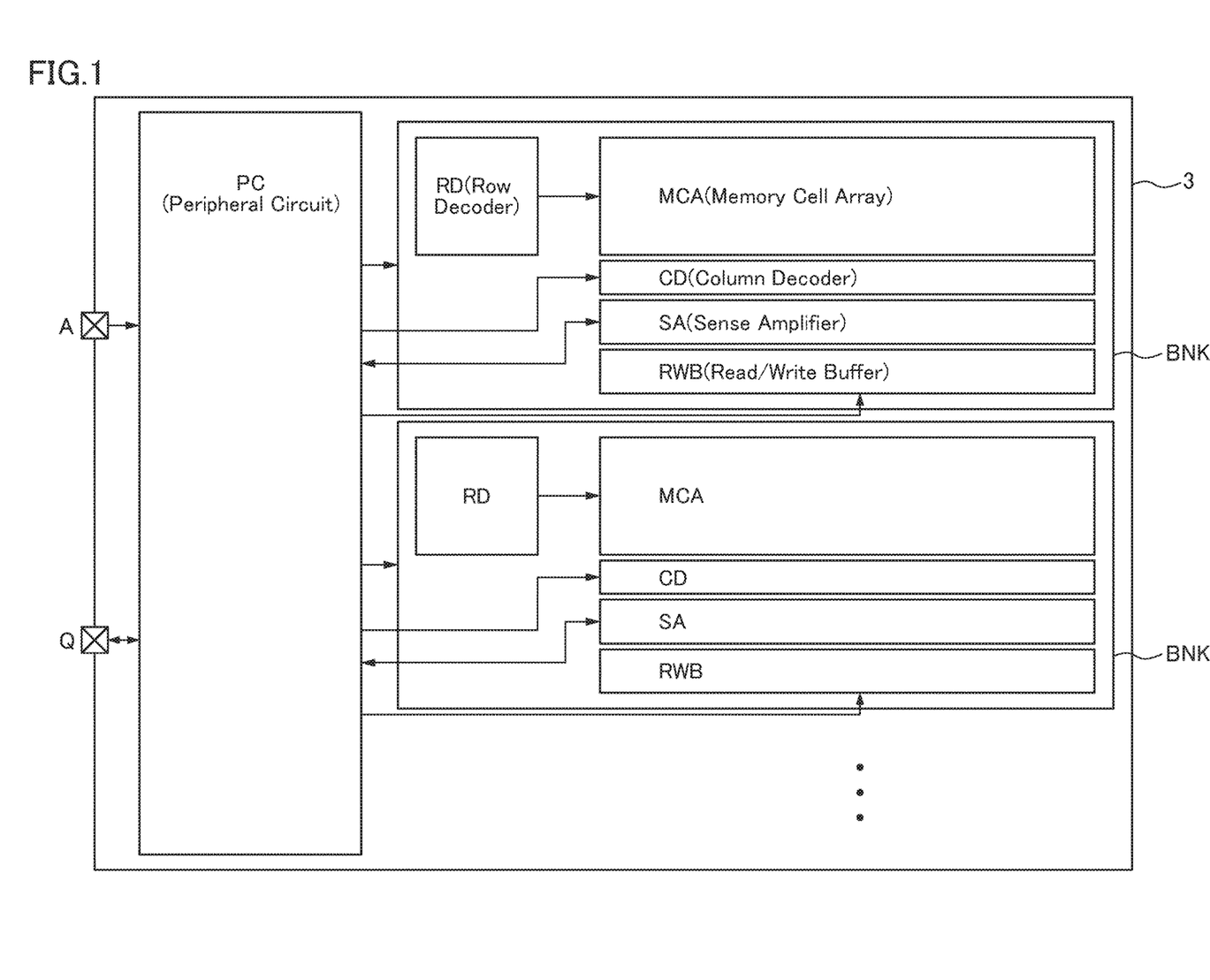
FIG. 1 is a block diagram showing a configuration of a memory system according to an embodiment.

FIG. 1 is a block diagram showing a configuration of a memory system 3 according to an embodiment.

A semiconductor memory device according to the embodiment is a three-dimensional NAND flash memory in which memory cells are three-dimensionally disposed.

The memory system 3 shown in FIG. 1 includes a memory cell array MCA, a column decoder CD, a row decoder RD, a sense amplifier SA, a read/write buffer RWB, and a peripheral circuit PC.

The memory cell array MCA includes a plurality of memory cells MC. The memory cell array MCA is divided into a plurality of banks BNK in one chip, and a sense amplifier SA, a data latch DL, an address latch AL, and the like are provided for each bank BNK.

The sense amplifier SA writes data to the memory cell MC by applying a write voltage to the memory cell MC, or reads data from the memory cell MC by applying a read voltage to the memory cell MC.

The read/write buffer RWB temporarily holds the data or the address detected by the sense amplifier SA for each page, or temporarily holds the data or the address to be written to the memory cell array MCA for each page.

The row decoder RD and the column decoder CD access the memory cell array MCA on the basis of a bank address or a page address, and apply the write voltage or the read voltage to a word line WL or a bit line BL to be described later. The row decoder RD applies the write voltage or the read voltage to a selected word line selected from a plurality of word lines WL. The column decoder CD connects a selected bit line selected from a plurality of bit lines BL to the sense amplifier SA. The sense amplifier SA applies the write voltage or the read voltage to the selected bit line. In this way, the memory system 3 can write data to a desired memory cell MC in the bank BNK or read data from the desired memory cell MC.

The peripheral circuit PC includes a voltage generation circuit, a read/write engine, an address controller, a command controller, and an input/output circuit (not shown), for example. A voltage generation circuit GEN generates a voltage of the word line WL or a voltage of the bit line BL necessary for a data read operation and a data write operation. The read/write engine causes the column decoder CD and the row decoder RD to write data to the desired memory cell MC in the bank BNK, or reads data from the desired memory cell MC in the bank BNK, according to a command and an address. The read/write engine transfers read data to a DQ buffer of the input/output circuit. The address controller receives a row address and a column address and decodes these addresses. The command controller receives commands indicating various operations such as the data read operation and the data write operation and transfers these commands to the read/write engine. The input/output circuit (IC) captures the command and the address from a CA terminal CA, transfers the command to the command controller, and transfers the address to the address controller. The command may be a write command indicating the write operation or a read command indicating the read operation. The address may be a bank address indicating any bank BNK of the memory cell array MCA and an address indicating a page or a memory cell MC of a read or write target in the bank BNK. Further, the input/output circuit captures the write data from the DQ terminal and transfers the write data to the read/write buffer RWB. Alternatively, the input/output circuit receives the read data held in the data latch DL and outputs the read data from the DQ terminal.

A memory controller (not shown) that wholly controls a plurality of memory systems 3 may be provided outside the memory system 3.

Figure 2:
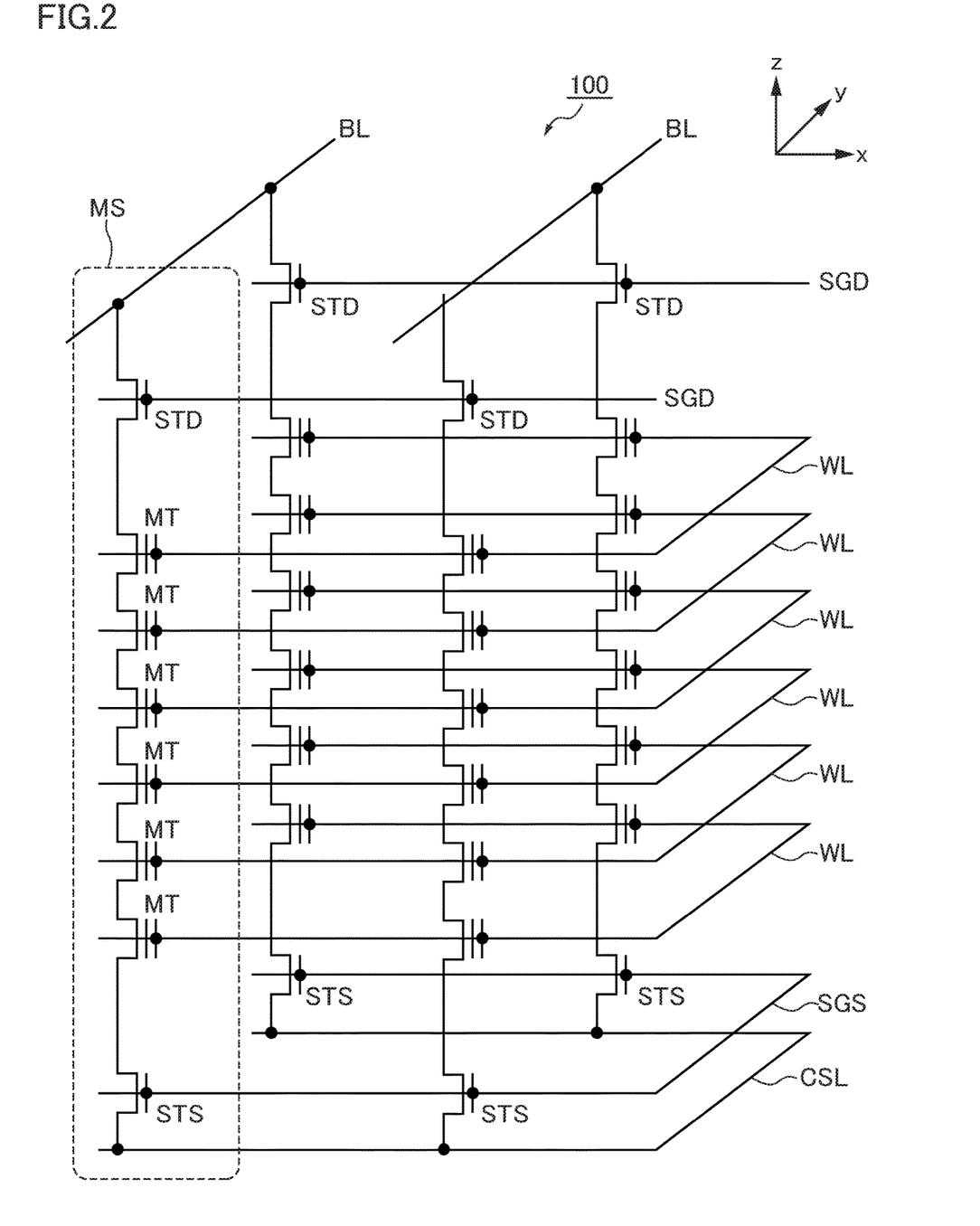
FIG. 2 is an equivalent circuit diagram of a semiconductor memory device according to the embodiment.

FIG. 2 is an equivalent circuit diagram of a main portion of a semiconductor memory device 100 according to the embodiment.

The semiconductor memory device 100 according to the embodiment is a three-dimensional NAND flash memory in which memory cells are three-dimensionally disposed.

As shown in FIG. 2, the semiconductor memory device 100 includes a plurality of word lines WL, a common source line CSL, a source selection gate line SGS, a plurality of drain selection gate lines SGD, a plurality of bit lines BL, and a plurality of memory strings MS. The semiconductor memory device 100 includes the memory cell array MCA by including the memory strings MS.

The memory string MS has a source selection transistor STS, a plurality of memory cell transistors MT, and a drain selection transistor STD connected in series between the common source line CSL and the bit line BL.

Note that the number of word lines WL, the number of bit lines BL, the number of memory strings MS, the number of memory cell transistors MT, and the number of drain selection gate lines SGD are not limited to those in FIG. 1.

Figure 3:
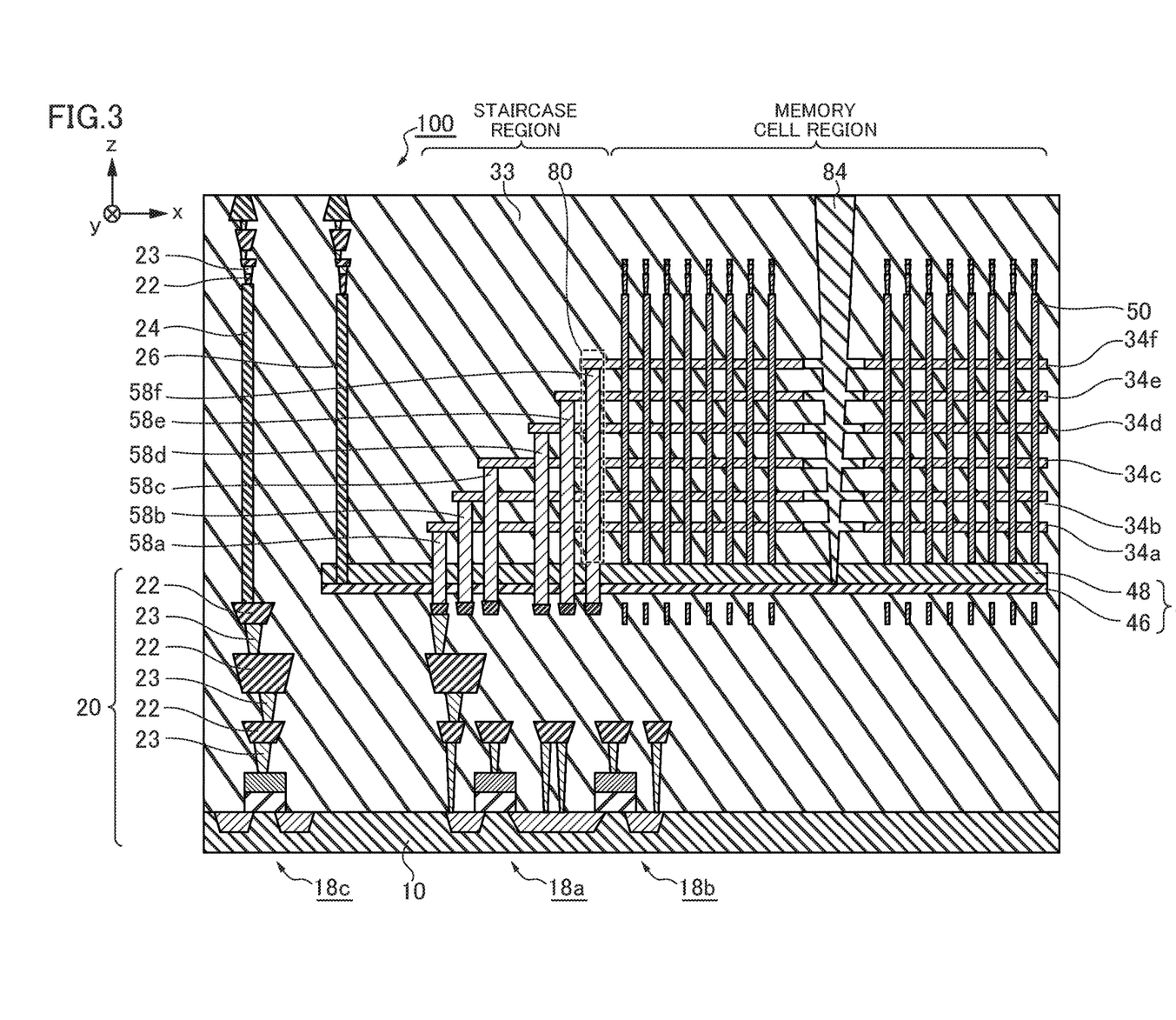
FIG. 3 is a schematic cross-sectional view of the semiconductor memory device according to the embodiment.

FIG. 3 is a schematic cross-sectional view of the semiconductor memory device according to the embodiment.

In FIG. 3, illustration of the source selection gate line SGS, the drain selection gate line SGD, the source selection transistor STS, the drain selection transistor STD, the bit line BL, and the barrier metal is omitted.

A substrate 10 is, for example, a semiconductor substrate. The substrate 10 is, for example, a silicon substrate. The substrate 10 is disposed so that an xy plane and a substrate plane are parallel, in FIG. 3. Here, an x axis, a y axis perpendicular to the x axis, and a z axis perpendicular to the x axis and the y axis are defined. It is assumed that the surface of the substrate 10 is disposed parallel to the xy plane. A z direction parallel to the z axis is an example of a first direction, and an x direction parallel to the x axis is an example of a second direction.

A plurality of transistors 18 are provided in the substrate 10. For example, transistors 18a, 18b, and 18c are provided in the substrate 10.

A first insulating layer 33 is provided on the substrate 10. The first insulating layer 33 includes, for example, silicon oxide.

An integrated circuit 20 is provided in the substrate 10 and the first insulating layer 33. The integrated circuit 20 has a plurality of transistors 18, contacts 23 electrically connected to the transistors 18, and wirings 22 electrically connected to the contacts 23.

A buried source line 44 is provided on the integrated circuit 20. The buried source line 44 has, for example, a buried source line lower layer portion 46 including tungsten (W) and an buried source line upper layer portion 48 including polysilicon. The buried source line 44 is supplied with a potential from the integrated circuit 20. The buried source line 44 corresponds to the common source line CSL in FIG. 1.

Above the substrate 10, a plurality of plate-like conductive layers 34 extending parallel to the substrate plane of the substrate 10 are provided over a staircase region and a memory cell region. For example, conductive layers 34a, 34b, 34c, 34d, 34e, and 34f as the conductive layers 34 are stacked with the first insulating layer 33 interposed therebetween. In the semiconductor memory device 100 shown in FIG. 3, the conductive layers 34 are formed in a staircase shape in the x direction in FIG. 3. Specifically, the conductive layers 34 are disposed as follows.

The conductive layer 34b is a plate-like conductive layer that is disposed above the conductive layer 34a so as to be separated from the conductive layer 34a and extends parallel to the conductive layer 34a, such that an end of the conductive layer 34a has a protruding staircase shape in the staircase region.

The conductive layer 34c is a plate-like conductive layer that is disposed above the conductive layer 34b so as to be separated from the conductive layer 34b and extends parallel to the conductive layer 34b, such that an end of the conductive layer 34b has a protruding staircase shape in the staircase region.

The conductive layer 34d is a plate-like conductive layer that is disposed above the conductive layer 34c so as to be separated from the conductive layer 34c and extends parallel to the conductive layer 34c, such that an end of the conductive layer 34c has a protruding staircase shape in the staircase region.

The conductive layer 34e is a plate-like conductive layer that is disposed above the conductive layer 34d so as to be separated from the conductive layer 34d and extends parallel to the conductive layer 34d, such that an end of the conductive layer 34d has a protruding staircase shape in the staircase region.

The conductive layer 34f is a plate-like conductive layer that is disposed above the conductive layer 34e so as to be separated from the conductive layer 34e and extends parallel to the conductive layer 34e, such that an end of the conductive layer 34e has a protruding staircase shape in the staircase region.

The conductive layers 34a, 34b, 34c, 34d, 34e, and 34f function as the word lines WL. Note that a positional relation between the substrate 10 and the conductive layers 34a, 34b, 34c, 34d, 34e, and 34f is not limited to that described in the embodiment.

In the semiconductor memory device 100 according to the embodiment, the number of conductive layers 34 is six, but the number of conductive layers 34 is not limited thereto.

Electrode members 58 are provided in the staircase region. In the example of FIG. 3, electrode members 58a, 58b, 58c, 58d, 58e, and 58f are provided. Each electrode member 58 functions as a contact for connecting the corresponding conductive layer 34 and the wiring 22 on the side of the substrate.

The electrode member 58a is connected to the conductive layer 34a at a position where the conductive layer 34a protrudes from the conductive layers 34b, 34c, 34d, 34e, and 34f, in the staircase region. In addition, the electrode member 58a extends from the conductive layer 34a to the substrate (here, the "substrate" includes the integrated circuit 20 formed on the substrate 10).

The electrode member 58b is connected to the conductive layer 34b at a position where the conductive layer 34b protrudes from the conductive layers 34c, 34d, 34e, and 34f, in the staircase region. The electrode member 58b extends from the conductive layer 34b to the substrate (here, the "substrate" includes the integrated circuit 20 formed on the substrate 10), and penetrates the conductive layer 34a under the conductive layer 34b.

The electrode member 58c is connected to the conductive layer 34c at a position where the conductive layer 34c protrudes from the conductive layers 34d, 34e, and 34f, in the staircase region. The electrode member 58c extends from the conductive layer 34c to the substrate (here, the "substrate" includes the integrated circuit 20 formed on the substrate 10), and penetrates the conductive layers 34a and 34b under the conductive layer 34c.

The electrode member 58d is connected to the conductive layer 34d at a position where the conductive layer 34d protrudes from the conductive layers 34e and 34f, in the staircase region. The electrode member 58d extends from the conductive layer 34d to the substrate (here, the "substrate" includes the integrated circuit 20 formed on the substrate 10), and penetrates the conductive layers 34a, 34b, and 34c under the conductive layer 34d.

The electrode member 58e is connected to the conductive layer 34e at a position where the conductive layer 34e protrudes from the conductive layer 34f, in the staircase region. The electrode member 58e extends from the conductive layer 34e to the substrate (here, the "substrate" includes the integrated circuit 20 formed on the substrate 10), and penetrates the conductive layers 34a, 34b, 34c, and 34d under the conductive layer 34e.

The electrode member 58f is connected to the conductive layer 34f in the staircase region. The electrode member 58f extends from the conductive layer 34f to the substrate (here, the "substrate" includes the integrated circuit 20 formed on the substrate 10), and penetrates the conductive layers 34a, 34b, 34c, 34d, and 34e under the conductive layer 34f.

As a material for the conductive layers 34a, 34b, 34c, 34d, 34e, and 34f, for example, tungsten, titanium nitride, or copper is preferably used. Note that other metal, a metal semiconductor compound, or a conductive material such as a semiconductor may be used as the material for the conductive layers 34a, 34b, 34c, 34d, 34e, and 34f.

As a material for the electrode members 58a, 58b, 58c, 58d, 58e, and 58f (and the other electrode members (not shown) described above), for example, tungsten, titanium nitride, or copper is preferably used. Note that other metal, a metal semiconductor compound, or a conductive material such as a semiconductor may be used as the material for the electrode members 58a, 58b, 58c, 58d, 58e, and 58f.

Note that a method for connecting the conductive layer 34 and the electrode member 58 is not limited thereto.

A memory pillar 50 penetrates the conductive layers 34a, 34b, 34c, 34d, 34e, and 34f in the memory cell region.

A via 24 is electrically connected to the transistor 18c provided in the substrate 10 via the wiring 22 and the contact 23.

The electrode members 58a, 58b, 58c, 58d, 58e, and 58f are electrically connected to the transistors 18a and 18b via the wiring 22 and the contact 23.

A via 26 connected to the buried source line 44 is electrically connected to a transistor not shown (an element similar to the transistor 18) via the wiring 22 and the contact 23.

A reinforcing member 80 is provided to extend perpendicularly to the substrate plane in the staircase region. As a material for the reinforcing member 80, for example, silicon oxide is preferably used. As described later, instead of each conductive layer 34, a silicon nitride layer is first formed, and the silicon nitride layer is replaced with the conductive layer 34. At that time, the reinforcing member 80 is once disposed to maintain a stacked structure for hollowing.

A dividing film 84 is a portion provided with a groove used for introducing and discharging a wet etching solution used for forming the conductive layer 34 and the electrode member 58, and for introducing a conductive material, when the semiconductor memory device 100 to be described later is manufactured. After the conductive material is introduced, the groove is filled with, for example, silicon oxide or the like, and the dividing film 84 is formed.

Figure 4:
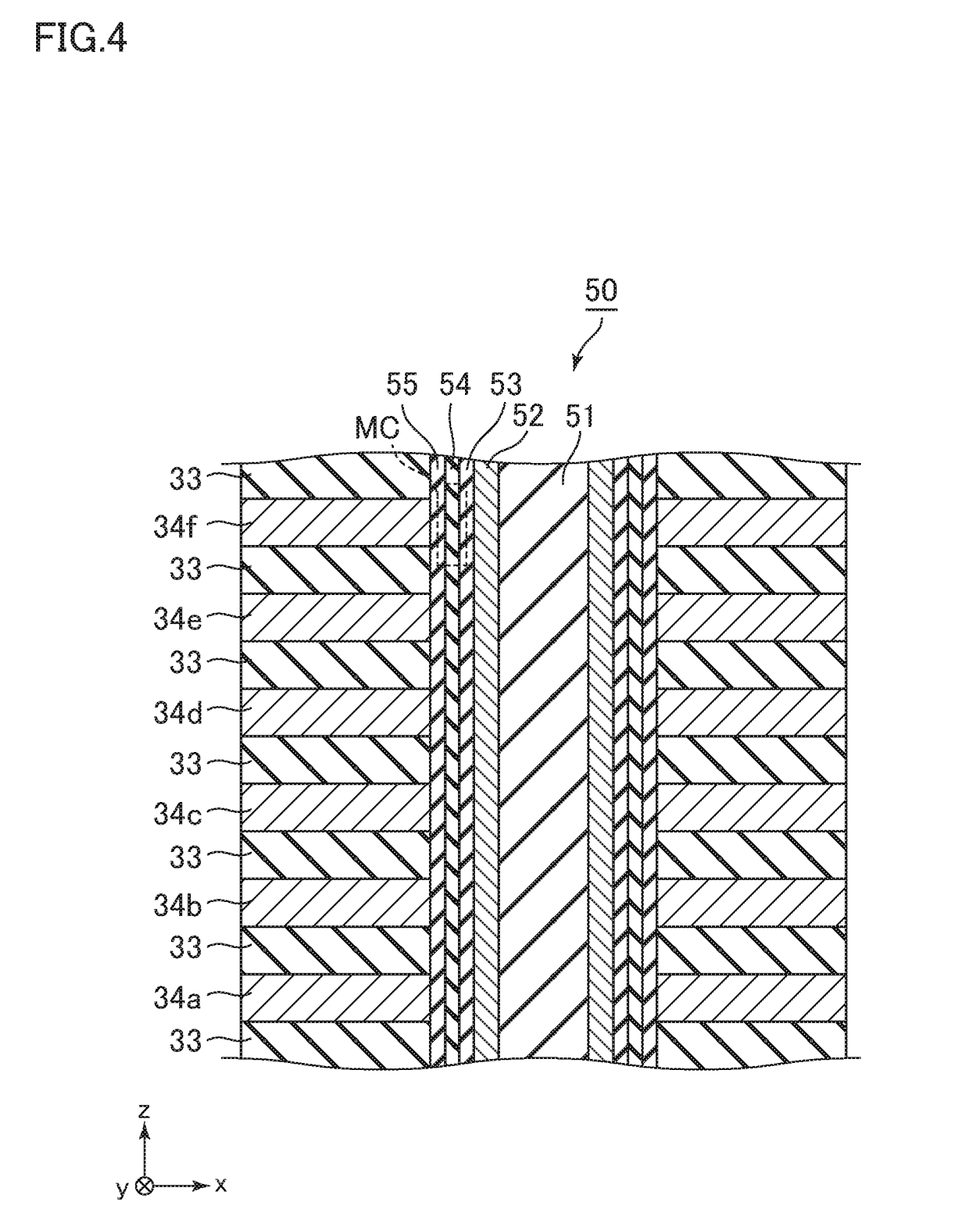
FIG. 4 is a schematic cross-sectional view near a memory pillar of the semiconductor memory device according to the embodiment.

FIG. 4 is a schematic cross-sectional view of the memory pillar 50 of the semiconductor memory device 100 according to the embodiment.

The memory pillar 50 includes a core member 51, a signal line 52 (an example of a pillar portion or a pillar), a tunnel insulating film 53, a charge storage film 54, and a block insulating film 55.

The core member 51 is provided in the memory pillar 50. The core member 51 is, for example, silicon oxide.

The signal line 52 including a semiconductor film is provided around the core member 51 in the memory pillar 50. The signal line 52 is, for example, a pillar including a semiconductor material such as silicon. The signal line 52 is electrically connected to the buried source line 44.

The tunnel insulating film 53 is provided around the signal line 52. The charge storage film 54 is provided around the tunnel insulating film 53. The block insulating film 55 is provided around the charge storage film 54.

The tunnel insulating film 53 is an insulating film which is insulative but causes a current to flow when a predetermined voltage is applied. The tunnel insulating film 53 includes, for example, silicon oxide.

The charge storage film 54 is a film including a material capable of storing charges. The charge storage film 54 includes, for example, silicon nitride.

The block insulating film 55 is a film for suppressing the flow of charges between the charge storage film 54 and the conductive layer 34. The block insulating film 55 includes, for example, silicon oxide.

The memory cell MC is shown in a portion surrounded by a dotted line in FIG. 4. The memory cell MC is provided between the conductive layer 34 and the signal line 52, and Includes the charge storage film 54.

Note that illustration of the barrier metal is omitted in FIG. 4.

Figure 5A:
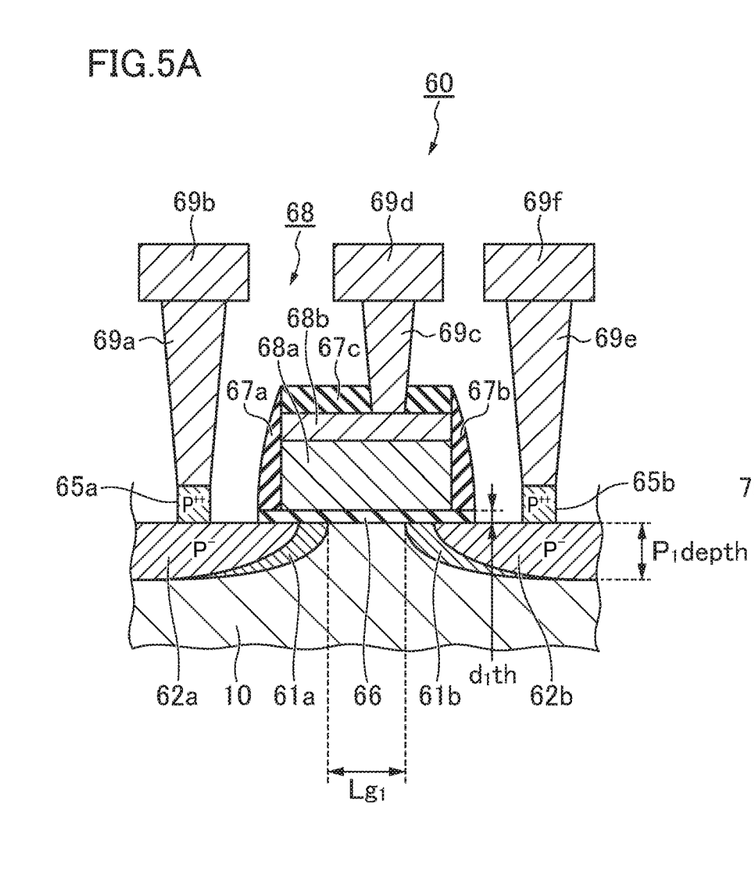
FIGS. 5A and 5B are schematic cross-sectional views of a first transistor and a second transistor according to the embodiment.
Figure 5B:
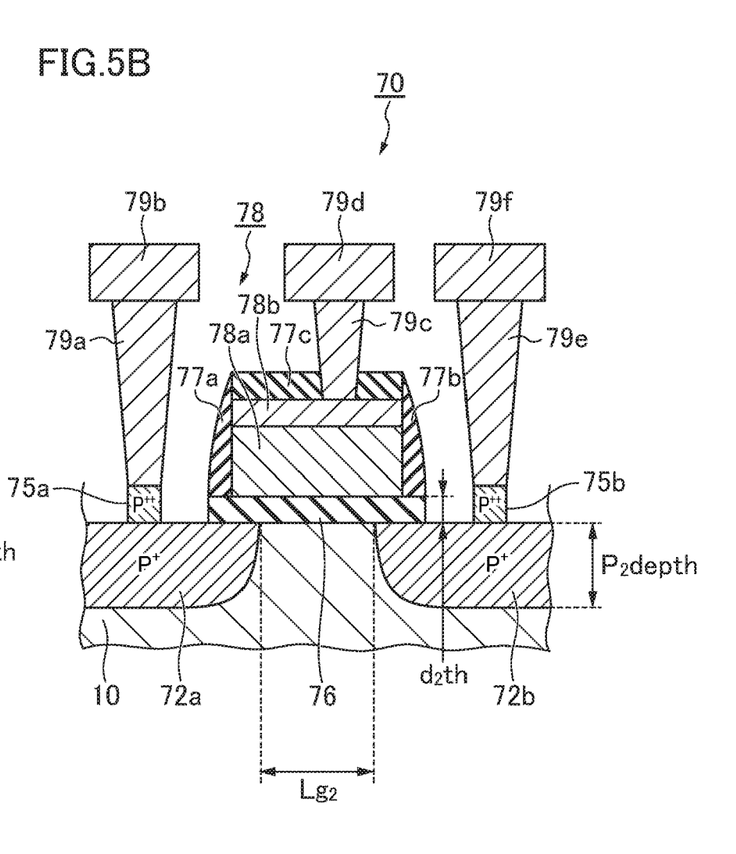

FIGS. 5A and 5B are schematic cross-sectional views of a first transistor 60 and a second transistor 70 according to the embodiment. FIG. 5A is a schematic cross-sectional view of the first transistor 60. FIG. 5B is a schematic cross-sectional view of the second transistor 70. Note that illustration of an interlayer insulating film 90 to be described later is omitted.

Each of the first transistor 60 and the second transistor 70 is a transistor used as any one of the transistors 18 (FIG. 2). The first transistor 60 is a transistor used for amplifying a signal of a voltage lower than that of the second transistor 70. The first transistor 60 outputs, for example, a current (an example of a first current) for driving a sense amplifier. On the other hand, the second transistor 70 is electrically connected to the charge storage film 54 via the conductive layer 34 or the signal line 52, for example. As a result, the second transistor 70 outputs a current (an example of a second current) used for writing or reading of the memory cell MC.

The first transistor 60 has a first source region 62a (an example of a first region), a first drain region 62b (an example of a second region), a first gate insulating film 66 (an example of a first insulating film), a first halo region 61a (an example of a fifth region), a second halo region 61b (an example of a sixth region), a first wiring 65a, a second wiring 65b, a first gate electrode 68, a first insulating film 67a, a second insulating film 67b, a third insulating film 67c, a wiring 69a, a wiring 69b, a wiring 69c, a wiring 69d, a wiring 69e, and a wiring 69f. Note that the halo region refers to a region in which the same type of impurities as a well region are formed at the tips of the source and the drain in order to efficiently suppress a leakage current between the source and the drain.

The first source region 62a of first conductive type (for example, $p^-$) is provided in the substrate 10. The first drain region 62b of first conductive type (for example, $p^-$) is provided in the substrate 10. The first gate insulating film 66 is provided on the first source region 62a and the first drain region 62b. The first source region 62a and the first drain region 62b preferably include impurity of first conductive type of $1 \times 10^{18}$ atoms/cm$^3$ or more and less than $5 \times 10^{19}$ atoms/cm$^3$. Further, the first source region 62a and the first drain region 62b are preferably formed by a lightly-doped drain (LDD) to facilitate the formation. However, the present disclosure is not limited thereto. Note that the first source region 62a and the first drain region 62b may be provided in a well (not shown) provided in the substrate 10.

The first wiring 65a of first conductive type (for example, $p^{++}$) is provided on the first source region 62a and is electrically connected to the first source region 62a. The second wiring 65b of first conductive type (for example, $p^{++}$) is provided on the first drain region 62b and is electrically connected to the first drain region 62b. The first wiring 65a and the second wiring 65b are formed by, for example, an epitaxial growth method, and include silicon. The first wiring 65a and the second wiring 65b preferably include impurity of first conductive type of $5 \times 10^{19}$ atoms/cm$^3$ or more.

The first halo region 61a of second conductive type is provided in the substrate 10 between the first source region 62a and the first drain region 62b. The second halo region 61b of second conductive type is provided in the substrate 10 between the first halo region 61a and the first drain region 62b. Note that the first halo region 61a and the second halo region 61b may be provided in a well (not shown) provided in the substrate 10. The first halo region 61a and the second halo region 61b are provided to suppress the extension of a depletion layer. Note that the first halo region 61a and the second halo region 61b may not be provided.

The first gate electrode 68 is provided on the first gate insulating film 66. The first gate electrode 68 has an electrode portion 68a including polysilicon of first conductive type (for example, $p^+$), and an electrode portion 68b provided on the electrode portion 68a and including tungsten silicide (WSi) or a stacked film of WSi and titanium nitride (TiN).

The first insulating film 67a and the second insulating film 67b are provided on the first gate insulating film 66 on both sides of the first gate electrode 68, respectively. The first insulating film 67a and the second insulating film 67b include, for example, silicon oxide. The first insulating film 67a and the second insulating film 67b are so-called sidewall spacers.

The third insulating film 67c is provided on the first gate electrode 68. The third insulating film 67c includes, for example, silicon nitride. The third insulating film 67c is used as a hard mask, for example. Note that the third insulating film 67c may not be provided.

The wiring 69a is provided on the first wiring 65a and is electrically connected to the first wiring 65a. The wiring 69b is provided on the wiring 69a and is electrically connected to the wiring 69a. The wiring 69c is provided on the first gate electrode 68 and is electrically connected to the first gate electrode 68. The wiring 69d is provided on the wiring 69c and is electrically connected to the wiring 69c. The wiring 69e is provided on the second wiring 65b and is electrically connected to the second wiring 65b. The wiring 69f is provided on the wiring 69e and is electrically connected to the wiring 69e. The wiring 69a, the wiring 69b, the wiring 69c, the wiring 69d, the wiring 69e, and the wiring 69f include, for example, tungsten (W), copper (Cu), or polysilicon including impurities.

The second transistor 70 has a second source region 72a (an example of a third region), a second drain region 72b (an example of a fourth region), a second gate insulating film 76 (an example of a second insulating film), a third wiring 75a, a fourth wiring 75b, a second gate electrode 78, a fourth insulating film 77a, a fifth insulating film 77b, a sixth insulating film 77c, a wiring 79a, a wiring 79b, a wiring 79c, a wiring 79d, a wiring 79e, and a wiring 79f. The second gate electrode 78 has an electrode portion 78a and an electrode portion 78b.

The second transistor 70 is different from the first transistor 60 in that the first halo region 61a and the second halo region 61b are not provided. Further, impurity concentrations of first conductive type of the second source region 72a and the second drain region 72b are different from the impurity concentrations of first conductive type of the first source region 62a and the first drain region 62b of the first transistor 60 in that it is preferable to include the impurity concentration of $5 \times 10^{19}$ atoms/cm$^3$ or more. Although the impurity concentrations of first conductive type of the third wiring 75a and the fourth wiring 75b are within the same numerical range as the impurity concentrations of first conductive type of the second source region 72a and the second drain region 72b, the impurity concentrations of first conductive type of the third wiring 75a and the fourth wiring 75b are preferably higher than the impurity concentrations of first conductive type of the second source region 72a and the second drain region 72b.

The impurity concentrations of first conductive type of the second source region 72a and the second drain region 72b of the second transistor 70 are higher than the impurity concentrations of first conductive type of the first source region 62a and the first drain region 62b of the first transistor 60.

A thickness $d_2$th of the second gate insulating film 76 is preferably larger than a thickness $d_1$th of the first gate insulating film 66. Further, a distance $Lg_2$ between the second drain region 72b and the second source region 72a is preferably longer than a distance $Lg_1$ between the first halo region 61a and the second halo region 61b. Further, depths $P_2$depth of the second source region 72a and the second drain region 72b is preferably larger than depths $P_1$depth of the first source region 62a and the first drain region 62b.

FIGS. 6A to 7C are schematic cross-sectional views of the second transistor 70 in the middle of manufacturing in a step of manufacturing the second transistor 70.

Figure 6A:
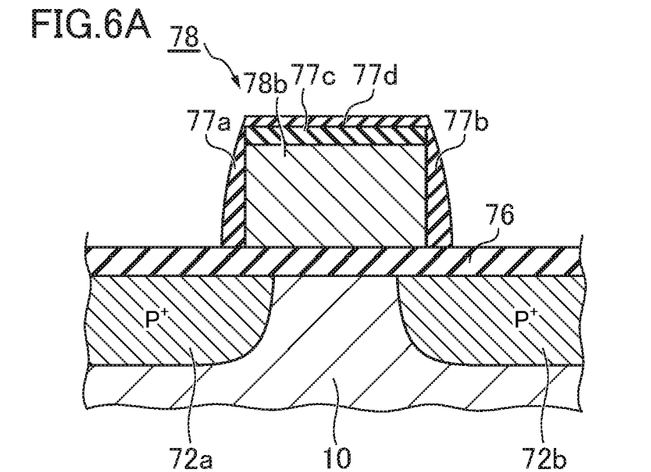
FIGS. 6A to 6C are schematic cross-sectional views of the second transistor in the middle of manufacturing in a step of manufacturing the second transistor according to the embodiment.

First, the second gate insulating film 76 is formed on the substrate 10. Next, the second gate electrode 78 including the electrode portion 78b, the fourth insulating film 77a, the fifth insulating film 77b, the sixth insulating film 77c, and the seventh insulating film 77d are formed on the second gate insulating film 76 (FIG. 6A). Note that, unlike FIG. 6A, the second gate electrode 78 may have the electrode portion 78a provided between the electrode portion 78b and the second gate insulating film 76 as shown in FIG. 5B. Further, the second gate insulating film 76 may be formed over the second source region 72a and the second drain region 72b as shown in FIG. 6A. Further, the seventh insulating film 77d may be formed integrally with the fourth insulating film 77a and the fifth insulating film 77b using the same material as the fourth insulating film 77a and the fifth insulating film 77b, for example, as shown in FIG. 6A. Further, as shown in FIG. 5B, the seventh insulating film 77d may not be provided. Next, the second source region 72a and the second drain region 72b are formed by, for example, an ion implantation method.

Figure 6B:
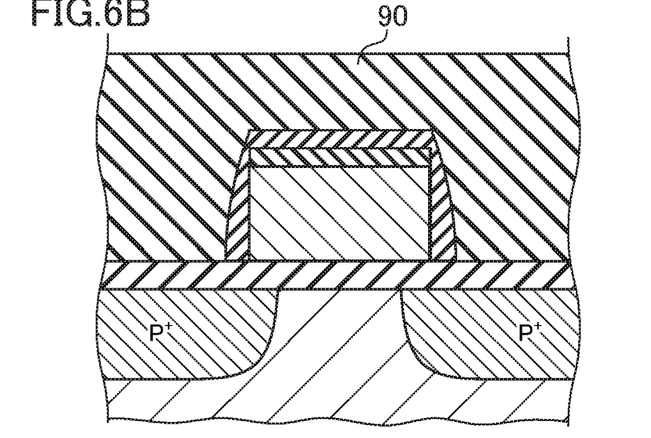

Next, the interlayer insulating film 90 made of, for example, a non-doped silicate glass (NSG) film is formed on the second gate insulating film 76, the fourth insulating film 77a, the fifth insulating film 77b, and the seventh insulating film 77d. Then, an upper portion of the interlayer insulating film 90 is flattened by chemical mechanical polishing (CMP) or the like (FIG. 6B).

Figure 6C:
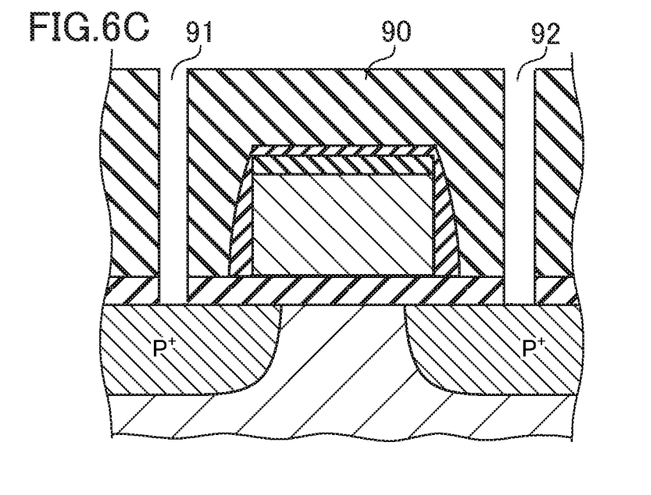

Next, a photoresist (not shown) is applied on the flattened interlayer insulating film 90. Next, the applied photoresist is exposed. Next, a part of the interlayer insulating film 90 and a part of the second gate insulating film 76 are removed by reactive ion etching (RIE) to form a contact hole 91 on the second source region 72a and a contact hole 92 on the second drain region 72b. Next, the photoresist is removed (FIG. 6C).

Figure 7A:
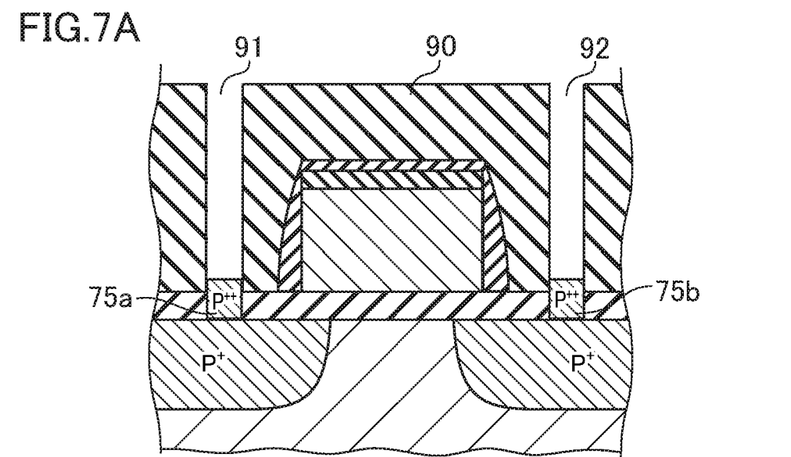
FIGS. 7A to 7C are schematic cross-sectional views of the second transistor in the middle of manufacturing in a step of manufacturing the second transistor according to the embodiment.

Next, the third wiring 75a provided on the second source region 72a and the fourth wiring 75b provided on the second drain region 72b are formed by, for example, an epitaxial growth method of silicon (Si). At this time, when the third wiring 75a and the fourth wiring 75b are of a p type, in order to perform doping with boron (B) to be p-type impurities, Si including B is epitaxially grown, or after the completion of the epitaxial growth, doping is performed with B by, for example, ion implantation (FIG. 7A).

Figure 7B:
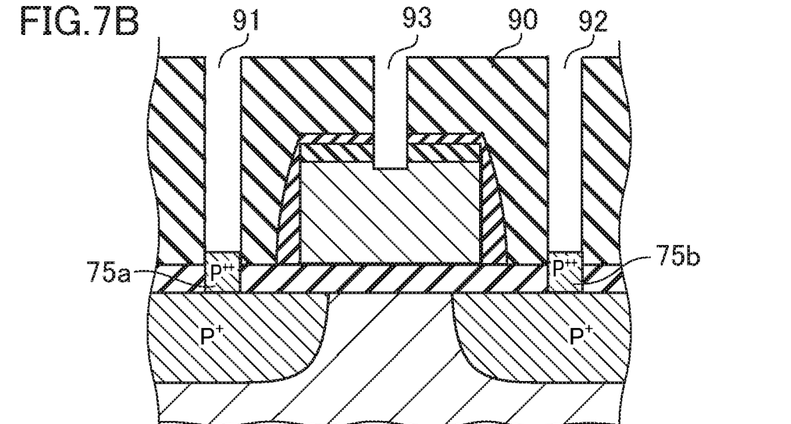

Next, a contact hole 93 is formed on the second gate electrode 78 so that an upper portion of the second gate electrode 78 is exposed (FIG. 7B).

Figure 7C:
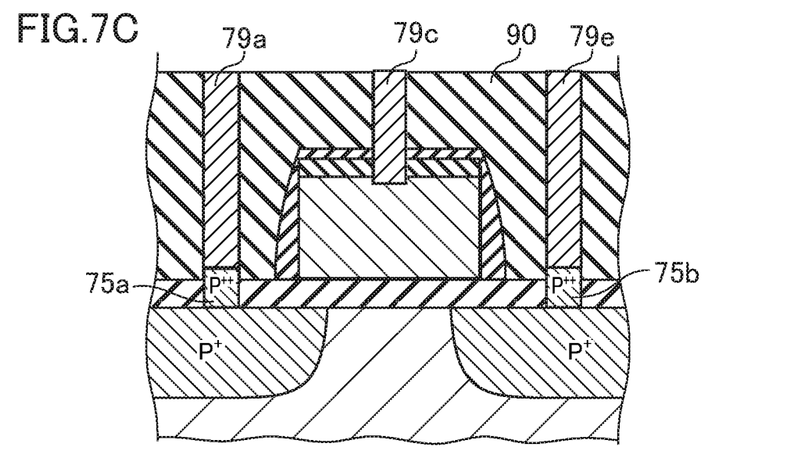

Next, the wiring 79a, the wiring 79e, and the wiring 79c including, for example, tungsten are formed in the contact holes 91, 92, and 93, respectively (FIG. 7C). Further, the wiring 79b, the wiring 79d, and the wiring 79f (not shown in FIG. 7C) are formed on the wiring 79a, the wiring 79e, and the wiring 79c, and the second transistor 70 according to the embodiment is obtained. Note that, depending on the shapes of the contact holes 91, 92, and 93, the shapes of the wiring 79a, the wiring 79c, and the wiring 79e may have a rectangular cross-section as shown in FIG. 7C, unlike FIG. 5B.

Figure 8A:
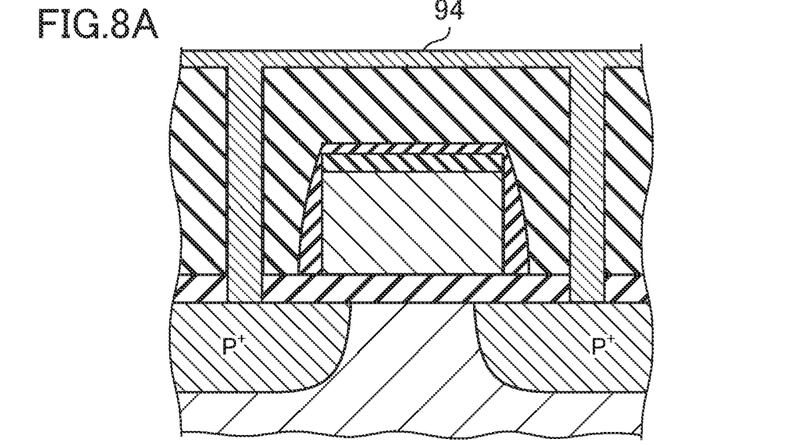
FIGS. 8A and 8B are schematic cross-sectional views of the second transistor in the middle of manufacturing in another step of manufacturing the second transistor according to the embodiment.
Figure 8B:
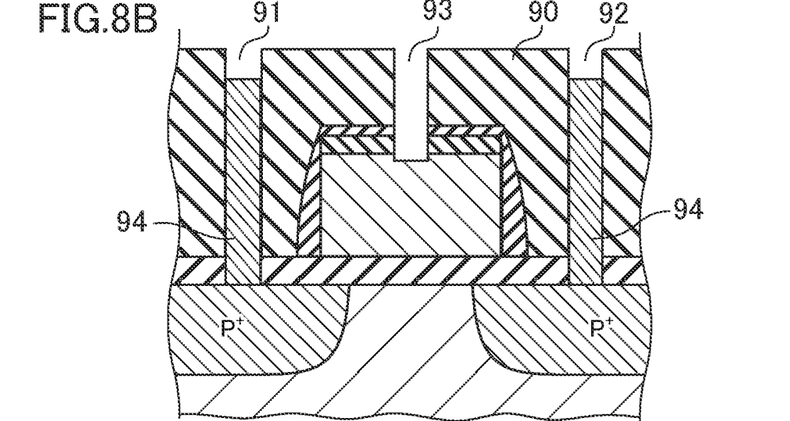

FIGS. 8A and 8B are schematic cross-sectional views of the second transistor 70 in the middle of manufacturing in another step of manufacturing the second transistor 70 according to the embodiment. Note that the steps shown in FIGS. 6A, 6B, and 6C are the same.

After the step shown in FIG. 6C, a polysilicon 94 is formed on the contact hole 91, the contact hole 92, and the interlayer insulating film 90. Next, an upper portion of the polysilicon 94 is flattened by, for example, CMP (FIG. 8A).

Next, the polysilicon on the interlayer insulating film 90 is removed by etch-back or the like (FIG. 8B). Next, the polysilicon in the contact holes 91 and 92 is doped with B by ion implantation or the like. Next, the contact hole 93 is formed on the second gate electrode 78 so that an upper portion of the second gate electrode 78 is exposed. The subsequent steps are as shown in FIG. 7C, for example. In this way, the first transistor 60 and the second transistor 70 are formed. Then, by forming the memory cell region and the staircase region on the integrated circuit 20, the semiconductor memory device shown in FIG. 3 is completed.

Note that illustration of the barrier metal is omitted in FIGS. 6A to 8B.

Next, functions and effects of the semiconductor memory device according to the embodiment will be described.

As a transistor used in a semiconductor memory device according to a comparative example, a first halo region and a second halo region are formed, then a gate insulating film, a gate electrode, and sidewall spacers are formed, and then a $p^+$-type source region and a $p^+$-type drain region are formed. Then, a case where p-type impurities are diffused to the vicinity of a channel end by heat treatment is considered. In this case, a distribution of the p-type impurities tends to vary due to a variation in the film thickness of the sidewall spacer. For this reason, there is a problem that a variation in transistor characteristics tends to increase.

In the semiconductor memory device according to the embodiment, the first transistor 60 has the first source region 62a of first conductive type, the first drain region 62b of first conductive type, the first wiring 65a of first conductive type provided on the first source region 62a, the first wiring 65a of first conductive type being electrically connected to the first source region 62a, and the first wiring 65a of first conductive type including a higher impurity concentration of first conductive type than the first source region 62a, and the second wiring 65b of first conductive type provided on the first drain region 62b, the second wiring 65b of first conductive type being electrically connected to the first drain region 62b, and the second wiring 65b of first conductive type including a higher impurity concentration of first conductive type than the first drain region 62b.

For the first transistor 60 used for amplifying a signal of a voltage lower than that of the second transistor 70, the impurity concentrations of first conductive type of the first source region 62a and the first drain region 62b are decreased, so that it is possible to suppress a variation in transistor characteristics such as a threshold voltage $V_{th}$ due to a variation in the film thickness of the sidewall spacer. Further, in the comparative example, in order to obtain superior contacts with the first source region 62a and the first drain region 62b, it is preferable to increase the impurity concentrations of first conductive type of the first source region 62a and the first drain region 62b. However, in the semiconductor memory device according to the embodiment, the first wiring 65a including the higher impurity concentration of first conductive type than the first source region 62a and the second wiring 65b of first conductive type including the higher impurity concentration of first conductive type than the first drain region 62b are used. Therefore, it is possible to obtain superior contacts with the first source region 62a and the first drain region 62b while decreasing the impurity concentrations of first conductive type of the first source region 62a and the first drain region 62b.

More specifically, the first source region 62a and the first drain region 62b preferably include impurity of first conductive type of $1 \times 10^{18}$ atoms/cm$^3$ or more and less than $5 \times 10^{19}$ atoms/cm$^3$, and the first wiring 65a and the second wiring 65b preferably include impurity of first conductive type of $5 \times 10^{19}$ atoms/cm$^3$ or more.

On the other hand, the second transistor 70 preferably has the second source region 72a including a higher impurity concentration of first conductive type than the first source region 62a, the second drain region 72b including a higher impurity concentration of first conductive type than the first drain region 62b, the third wiring including a higher impurity concentration of first conductive type than the second source region 72a, and the fourth wiring including a higher impurity concentration of first conductive type than the second drain region 72b. This is because the second transistor 70 is used for amplifying a signal of a voltage higher than that of the first transistor 60.

More specifically, the second source region 72a and the second drain region 72b preferably include impurity of first conductive type of $5 \times 10^{19}$ atoms/cm$^9$ or more, and the third wiring 75a and the fourth wiring 75b preferably include impurity of first conductive type of $5 \times 10^{19}$ atoms/cm$^3$ or more.

Although the impurity concentrations of first conductive type of the third wiring 75a and the fourth wiring 75b are within the same numerical range as the impurity concentrations of first conductive type of the second source region 72a and the second drain region 72b, the impurity concentrations of first conductive type of the third wiring 75a and the fourth wiring 75b are preferably higher than the impurity concentrations of first conductive type of the second source region 72a and the second drain region 72b.

Further, a thickness $d_{2th}$ of the second gate insulating film 76 is preferably larger than a thickness $d_{1th}$ of the first gate insulating film 66. Further, a distance $L_{g2}$ between the second drain region 72b and the second source region 72a is preferably longer than a distance $L_{g1}$ between the first halo region 61a and the second halo region 61b. Further, depths $P_{2depth}$ of the second source region 72a and the second drain region 72b are preferably larger than depths $P_{1depth}$ of the first source region 62a and the first drain region 62b.

The first transistor 60 is used, for example, as a logic transistor. For example, the first transistor 60 is preferably used for supplying a current for driving the sense amplifier SA. On the other hand, since the second transistor 70 is used for amplifying a signal of a voltage higher than that of the first transistor 60, the second transistor 70 preferably supplies a current (second current) to the conductive layer 34 or the signal line 52 through the sense amplifier SA to be used for writing of the memory cell MC.

In the above description, the first-conductivity type is the p type or the n type. However, particularly, when the first-conductivity type is the p type, an effect of reducing a variation in transistor characteristics of the transistor (p-channel transistor) can be expected.

According to the semiconductor memory device 100 of the embodiment, a semiconductor memory device with improved reliability can be provided.

While certain embodiments have been described, these embodiments have been presented by way of example only, and are not intended to limit the scope of the inventions. Indeed, Semiconductor Memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first transistor, the first transistor including
a substrate including a first region of first conductive type and a second region of the first conductive type,
a first insulating film provided on the first region and the second region,
a first wiring of the first conductive type provided on the first region, the first wiring being electrically connected to the first region, and the first wiring including a higher impurity concentration of the first conductive type than an impurity concentration of the first region, and
a second wiring of the first conductive type provided on the second region, the second wiring being electrically connected to the second region, and the second wiring including a higher impurity concentration of the first conductive type than an impurity concentration of the second region;
a conductive layer provided parallel to a substrate plane above the first transistor;
a pillar penetrating the conductive layer, the pillar including a semiconductor film; and
a charge storage film provided between the semiconductor film and the conductive layer.

2. The device according to claim 1, wherein
the first region and the second region include impurity of first conductive type of $1 \times 10^-$ atoms/cm$^3$ or more and less than $5 \times 10^{19}$ atoms/cm$^3$, and
the first wiring and the second wiring include impurity of first conductive type of $5 \times 10^{19}$ atoms/cm$^3$ or more.

3. The device according to claim I, further comprising:
a second transistor including
a third region of first conductive type included in the substrate, the third region including a higher impurity concentration of first conductive type than the impurity concentration of the first region,
a fourth region of first conductive type included in the substrate, the fourth region including a higher impurity concentration of first conductive type than the impurity concentration of the second region, a second insulating film provided on the third region and the fourth region, a third wiring of first conductive type provided on the third region, the third wiring being electrically connected to the third region, and the third wiring including a higher impurity concentration of first conductive type than the impurity concentration of the third region, and a fourth wiring of first conductive type provided on the fourth region, the fourth wiring being electrically connected to the fourth region, and the fourthwiring including a higher impurity concentration of first conductive type than the impurity concentration of the fourth region.

4. The device according to claim 3, wherein the third region and the fourth region include impurity of first conductive type of $5\times10^{33}$ atoms/cm$^3$ or more, and the third wiring and the fourth wiring include impurity of first conductive type of $5\times10^{19}$ atoms/cm$^3$ or more.

5. The device according to claim 3, wherein a thickness of the second insulating film is larger than a thickness of the first insulating film.

6. The device according to claim 3, further comprising:

a sense amplifier electrically connected to the charge storage film, wherein the first transistor supplies a first current for driving the sense amplifier, and the second transistor supplies a second current to the conductive layer or the pillar through the sense amplifier.

7. The device according to claim 3, wherein a depth of the third region is larger than a depth of the first region, and a depth of the fourth region is larger than a depth of the second region.

8. The device according to claim 3, wherein the first transistor further includes a fifth region of first conductive type provided between the first region and the second region and a sixth region of first conductive type provided between the first region and the fifth region.

9. The device according to claim 8, wherein a distance between the fifth region and the sixth region is shorter than a distance between the third region and the fourth region.

10. The device according to claim 1, wherein the first conductive type is a p type.

* * * * *